United States Patent [19]

Rodriguez-Pena et al.

[11] Patent Number: 4,571,539
[45] Date of Patent: Feb. 18, 1986

[54] HIGH VOLTAGE FIELD MAPPING APPARATUS AND METHOD

[75] Inventors: Alonso Rodriguez-Pena, Morelos, Mexico; Tsen-Chung Cheng, San Marino; Chuck Y. Wu, West Covina, both of Calif.

[73] Assignee: USC, Los Angeles, Calif.

[21] Appl. No.: 327,643

[22] Filed: Dec. 4, 1981

[51] Int. Cl.⁴ .............................................. G01R 5/28
[52] U.S. Cl. ........................................ 324/72; 324/96; 324/109; 324/457
[58] Field of Search ........................ 250/227; 332/7.51; 455/612; 324/95, 96, 97, 72.5, 109, 457, 458, 58 R, 244; 350/270, 269, 484, 96.14, 96.15, 96.20, 96.29; 356/32

[56] References Cited

U.S. PATENT DOCUMENTS

| | | | |
|---|---|---|---|
| 2,505,420 | 4/1950 | McCrary et al. | 250/227 X |
| 3,513,391 | 5/1970 | Heinrich et al. | 324/97 |
| 3,781,092 | 12/1973 | Sussman et al. | 250/227 X |
| 3,851,248 | 11/1974 | Spokas | 324/109 |
| 3,924,184 | 12/1975 | Spokas | 324/109 |
| 4,071,753 | 1/1978 | Fulenwider et al. | 356/32 |
| 4,147,979 | 4/1979 | Baues et al. | 350/96.13 |
| 4,368,430 | 1/1983 | Dale et al. | 324/244 |
| 4,376,248 | 3/1983 | Gialloreni et al. | 324/244 |
| 4,386,315 | 5/1983 | Young et al. | 324/96 |

OTHER PUBLICATIONS

J. McCann, "AC Probe Potential Measurement", Ontario Hydro Research Division Report, Jan. 1980.
K. Horii, et al., "Mechanical Resonance Type AC Potentiometer", Bul. Electrotech. Lab., vol. 33, No. 9, Japan, 1969.

Primary Examiner—Stewart J. Levy
Assistant Examiner—Stephen M. Baker
Attorney, Agent, or Firm—Nilsson, Robbins, Dalgarn, Berliner, Carson & Wurst

[57] ABSTRACT

Apparatus and method for mapping an existing electric field involve exposing a field responsive element to the electric field to produce movement of the element in the path of a light beam, and detecting modulation of the light beam by the element. In a preferred embodiment the light beam is passed to and from the field responsive element by optical waveguides.

14 Claims, 12 Drawing Figures

HIGH VOLTAGE FIELD MAPPING APPARATUS AND METHOD

BACKGROUND OF THE INVENTION

This invention relates generally to the art of mapping electric fields and, more particularly, to a practical high voltage AC field mapping apparatus and method.

In many applications it is desirable to map the equipotential electric field surrounding high voltage circuit components. In the design of high voltage AC insulating structures, a map of the electric field provides valuable information as to the voltage distribution across the structure. One can determine which portions of the structure will be most highly stressed, permitting the structure to be designed to achieve more uniform voltage distribution and minimize the possibility that any portion of it will fail.

A prior device for mapping high voltage electric fields utilizes a capacitive element placed in the field to determine the potential at a given point. However, the physical size of the device prevents it from being used to map field lines in confined spaces. In the case of high voltage insulators having complex shapes, it is often difficult or impossible to use a large probe to map field lines close to the surface of the insulator. The size of capacitive probes can also limit the spatial accuracy of the readings obtained, since the potential sensed by them is an average potential over the volume of a capacitor.

Another device for mapping high voltage AC fields is a mechanical resonance-type probe, as described in "Resonance AC Potentiometer", Horii et al, *Bul. Electrotech. Lab.*, Vol. 33, No. 9, Japan, 1969. The probe has a small elastic metal strip having a tip which oscillates at a resonant frequency in response to the electric field. The force on the probe tip is proportional to the square of the electrical potential at that location. In the method disclosed, a balancing voltage is applied to the strip to precisely cancel the potential of the electric field at the probe tip and cause the tip to stop moving. The probe can then be moved about in the electric field until the tip stops moving at one or more other locations, defining an equipotential line of the electric field.

In systems of the mechanical resonance type, motion of the probe tip has been monitored by direct observation using a 1400 millimeter telescope. Monitoring has also been accomplished by observing the interference pattern of a laser beam projected onto the probe tip, as disclosed in "AC Probe Potential Measurement", McCann et al, *Ontario Hydro Research Division Report*, January 1980 However, both techniques require unobstructed line-of-sight light paths, large open areas surrounding the object producing the electric field, and special lighting. In the case of telescope observation the lighting must be very good, while for observation with laser light the level of ambient light must be very low. Telescopes and lasers are also very time-consuming to align due to the relatively large distances involved. The minimum focal distance of the telescope used by Horii et al is approximately thirty feet. Because the mapping procedure requires movement of the probe to a large number of different locations about the sample, the telescope or laser must be repeatedly aligned.

Therefore, in many applications it is desirable to provide a simple and portable device for accurately mapping a high voltage electric field relative to a body of complex geometry.

SUMMARY OF THE INVENTION

The present invention comprises an apparatus for mapping an existing electric field, comprising: field responsive means; means for mounting the field responsive means for movement under the influence of the electric field; means for passing a light beam along a path, between first and second locations, that is interrupted by movement of the field responsive means for modulation of the light beam; and means for detecting the modulation of the light beam. In a preferred embodiment of the apparatus, the first and second locations are on opposite sides of the field responsive means and the light passing means includes first and second optical waveguide means. The two waveguide means terminate at the first and second locations, respectively, and are essentially coaxial and opposed to each other at the first and second locations for the passage of light therebetween.

The field responsive means preferably comprises an element having a resonant frequency of mechanical oscillation which is substantially twice the frequency of the existing electric field, and the apparatus preferably includes means for applying to the element a voltage essentially equal and opposite to the potential of the electric field. Any imbalance between the applied voltage and the electric field at the location of the element will thus produce oscillation of the element.

The light beam passed from the first location to the second location may itself be provided with a preselected modulated waveform synchronized with the oscillation of the field responsive element. The further modulation of the waveform by movement of the field responsive element significantly alters the waveform and distribution of the modulation frequency. These effects greatly facilitate the detection of movement of the field responsive element.

In method terms, a field responsive element is exposed to an existing electric field to produce movement of the element in response to the field. A light beam is passed between first and second locations adjacent to the element along a path interrupted by movement of the element, and modulation of the light beam by the element is detected.

The field mapping apparatus and method of the present invention enable equipotential lines of an existing electric field to be simply and accurately mapped relative to virtually any sample body. The compact nature of the probe element permits mapping to be done in confined spaces and at locations as close to or as far away from the sample as desired. Because the optical signal modulated by the field responsive element is conducted through optical waveguides, the light beam and the element are maintained in alignment as the probe is moved through space about the sample. A plurality of points along a particular equipotential line or surface can thus be located and plotted with the present invention in a short period of time. There is no need to realign the observation mechanism with the probe for each new measurement.

The apparatus and the method of the present invention are also free of stringent requirements for workspace and ambient lighting. The space available about the sample is adequate if the probe itself can be accommodated, and modulation of the light beam of the present invention can be detected electronically without regard to ambient light.

The optical waveguides used in the present invention to detect motion of the field responsive element perform their function without distorting the electric field being mapped. This is significant in that it eliminates a potential source of error in the equipotential plots obtained.

BRIEF DESCRIPTION OF THE DRAWINGS

The above and other objects of the present invention may be more fully understood from the following detailed description, taken together with the accompanying drawings, wherein similar reference characters refer to similar elements throughout and in which.

DESCRIPTION OF THE PREFERRED EMBODIMENT

Figure 1:
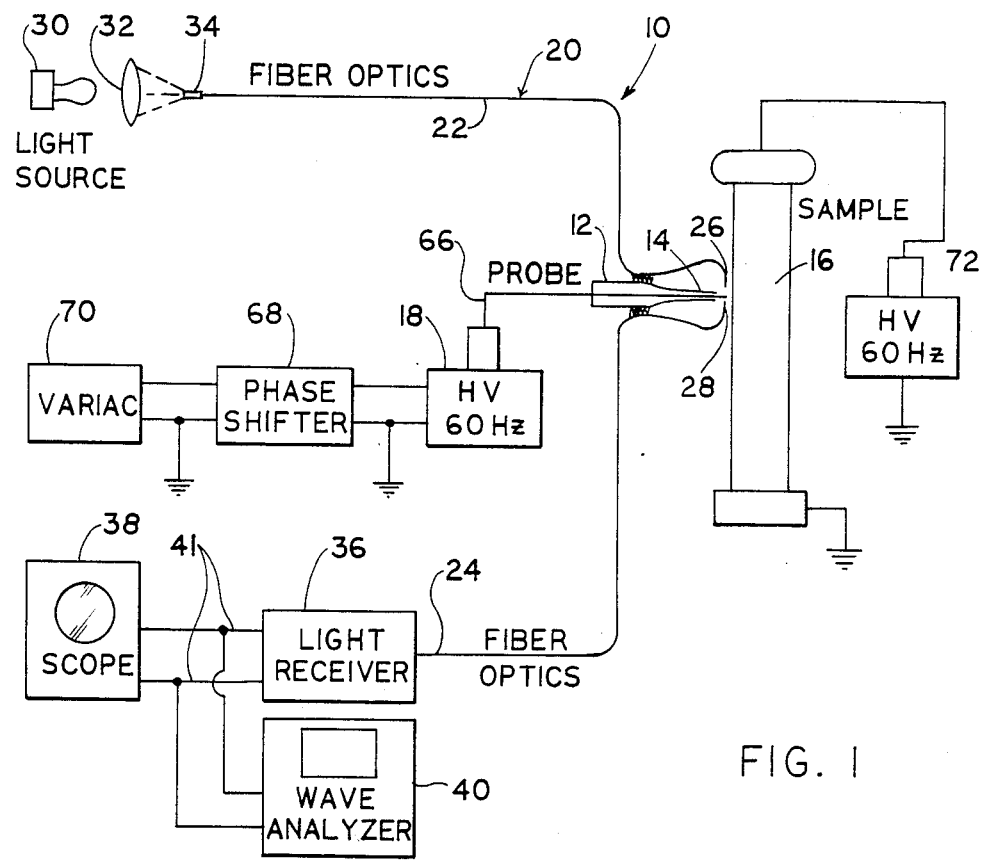
FIG. 1 is a schematic representation of a mapping apparatus constructed in accordance with the present invention, shown in conjunction with a sample about which an electric field is to be mapped.
Figure 12:
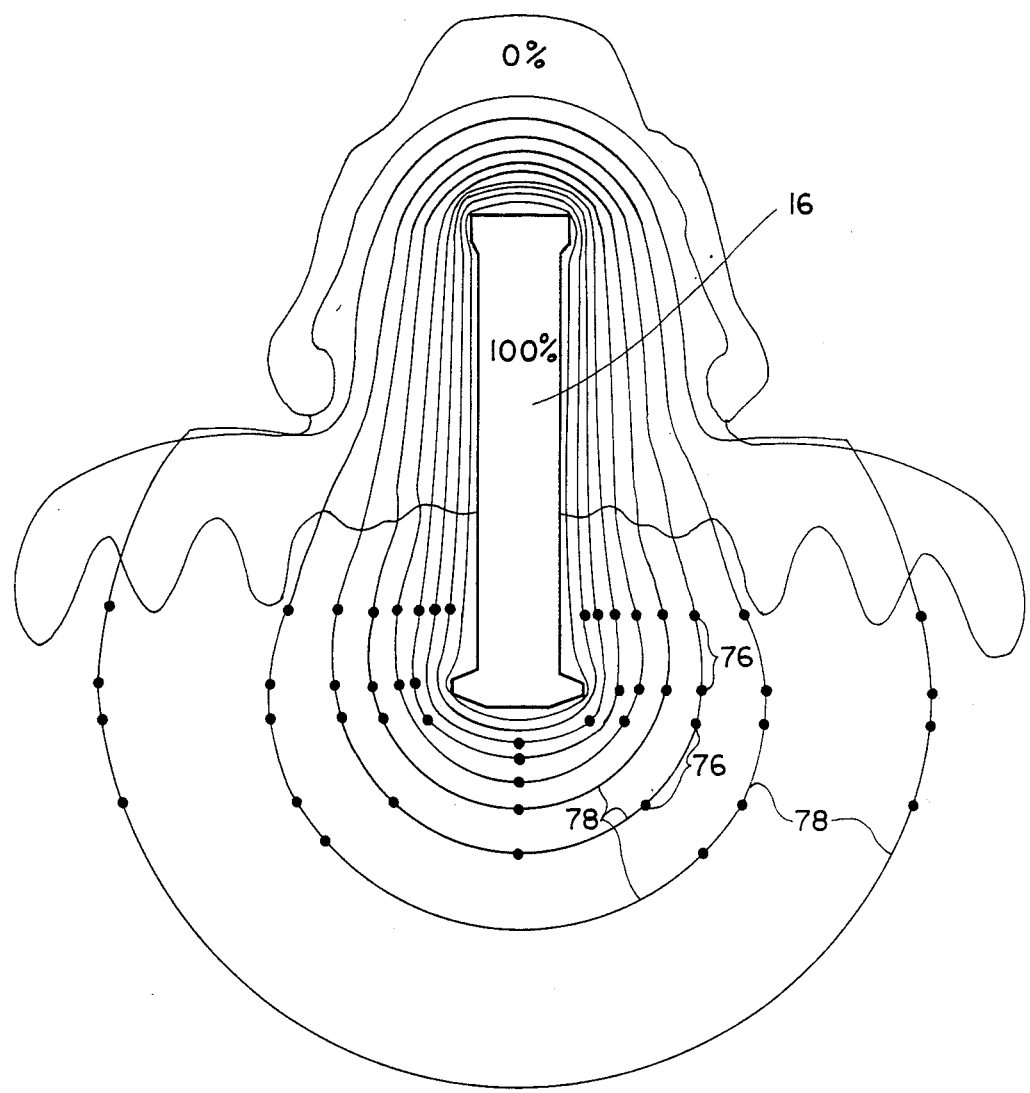
FIG. 12 is a sample equipotential field plot or map of the type obtainable with the apparatus and method of the present invention.

Referring now to the drawings, there is illustrated in FIG. 1 an apparatus for mapping an electric field, generally designated 10. The apparatus 10 includes a probe 12 having an elongated field responsive element 14 at one end thereof for oscillation in response to a high voltage AC electric field surrounding a sample 16. An AC voltage equal and opposite to the potential of the electric field is applied to the element 14 by a variable power supply 18, exactly cancelling the potential of the electric field at the location of the element 14 and causing the element to stop oscillating. This condition of nonoscillation is detected by an optical circuit 20. After the power supply 18 has been adjusted to stop oscillation of the element 14 at one location in the existing electric field, the probe 12 can be translated through the electric field for identification of other locations at which the element stops oscillating. Each of the locations is recorded and plotted on a graph of the type shown in FIG. 12 to define a particular equipotential line 78 of the field. FIG. 12 illustrates a plurality of such lines combined to form an equipotential map of the field.

The optical circuit 20 includes optical waveguides 22 and 24 terminating at ends 26 and 28, respectively, on opposite sides of the element 14. The element 14 is mounted for limited oscillation within a plane perpendicular to the ends 26 and 28, such that the oscillation modulates a beam of light passed between the ends.

Light is directed along the waveguide 22 by a light source 30 and a lens arrangement 32 focused on a second end 34 of the waveguide. The light source 30 is preferably a strobe light or other source of light having a preselected waveform which can be detected by electro-optical means. In the case where the electric field alternates at a frequency of 60 hertz and the element 14 alternates at 120 hertz, the light source 30 is preferably premodulated at a frequency of 120 hertz. The light beam conducted to the element 14 by the waveguide 22 is thus essentially synchronized with the movement of the element to enhance the effect of the oscillation on the light beam.

After the light beam passes the element 14, it is picked up by the end 28 of the waveguide 24 and carried to a light receiver 36 which transforms the optical signal to electrical form. The light receiver 36 may be any suitable light-to-electrical energy transducer operable in the range of the light source 30. A scope 38 and a wave analyzer 40 are connected in parallel to output lines 41 of the light receiver for display and analysis of the signal corresponding to the modulated light beam. The scope 38 displays the waveform of the light beam in the manner shown graphically at FIG. 10, while the wave analyzer displays the frequency distribution of the beam as shown in FIG. 11. The numerous peaks of FIG. 11 correspond to the principal modulation frequency of the light beam and various harmonics thereof.

Figure 10:
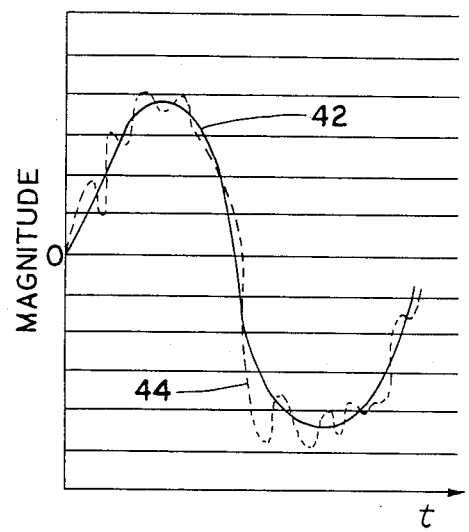
FIG. 10 is a somewhat diagrammatic graphical representation of a sample waveform of a light beam used in the practice of the present invention, both before and after modulation by movement of the field responsive element.
Figure 11:
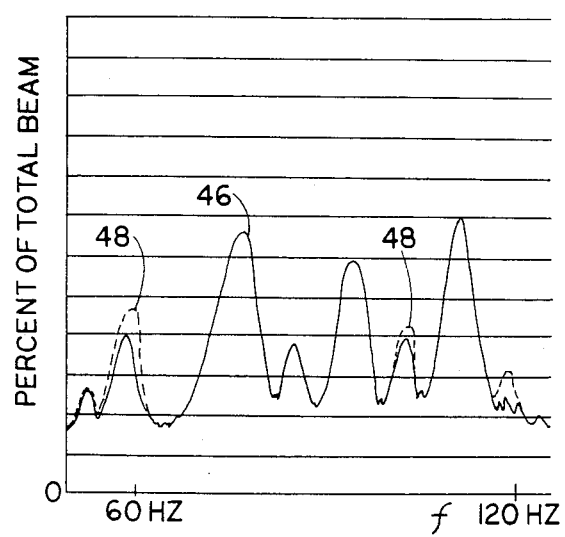
FIG. 11 is a somewhat diagrammatic graphical representation of a sample frequency distribution of a light beam used in the practice of the present invention, before and after modulation by the field responsive element.

As seen in FIG. 10, the light beam produced by the source 30 may initially have a sinusoidal waveform 42. Modulation of the light beam by the element 14 alters the waveform in a manner which is readily perceptible from the trace of the scope. The modulated waveform may, for example, be similar to that depicted by the broken line curve 44 of FIG. 10. Similarly, the light beam produced by the source 30 has a characteristic frequency distribution of the type shown in FIG. 11 at 46. Modulation of the light beam by the element 14 can alter the distribution, producing a different trace on the wave analyzer 40. The trace for the modulated wave may be similar to the broken line curve 48 of FIG. 11, showing significant increases in the 60 and 120 hertz components thereof The readouts of the scope 38 and the wave analyzer 40 provide an operator with a clear visual indication as to whether or not the element 14 is oscillating at a particular time. The differences produced in the readouts are particularly prominent when light from the source 30 is premodulated at a frequency synchronized with the frequency of oscillation of the element. In the preferred embodiment of the present invention, these frequencies are both approximately 120 hertz.

It will be understood that although the apparatus 10 is described herein as including both the scope 38 and the wave analyzer 40, in many situations it will be feasible to eliminate one or the other of them. Movement of the element 14 will be apparent from either of the instruments in most cases.

Figure 2:
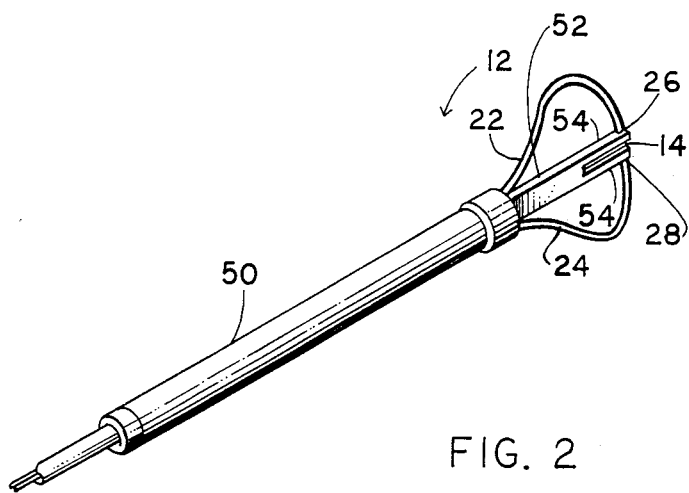
FIG. 2 is a perspective view of a probe structure of the apparatus illustrated in FIG. 1.

The structure of the probe 12 is shown in more detail in FIGS. 1 through 9. As seen in FIG. 2, the probe 12 comprises a wand 50 having a probe head 52 extending outwardly from one end thereof. The probe head 52 is elongated and generally aligned with the wand 50, and is provided at an outer end with a pair of parallel tangs 54 located on opposite sides of the element 14. The tangs 54 define a pair of inwardly facing wall portions 56 which are parallel to each other and to the element 14.

The waveguide ends 26 and 28 extend inwardly through the tangs 54 to locations slightly beyond the wall portions 56. The two ends are aligned with each other to direct light from the source 30 past an outer end 58 of the element 14. The outer end 58 thus partially interrupts the light beam passing between the waveguide ends 26 and 28.

The optical waveguides 22 and 24 may comprise any suitable optical fiber means, such as a bundle of continuous glass fibers for conducting light from the source 30.

Figures 3, 4, 5:
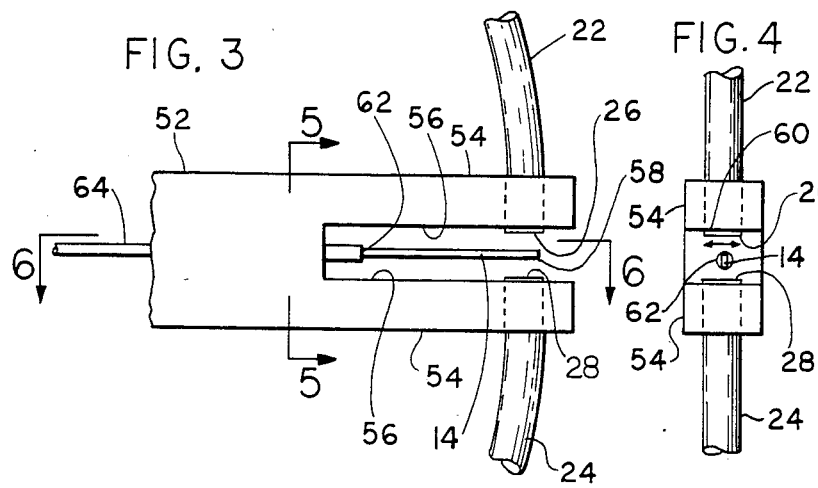
FIG. 3 is an enlarged fragmentary side elevational view of the probe structure of FIG. 2.
FIG. 4 is an end view of the structure of FIG. 3.
FIG. 5 is a vertical sectional view taken along the line 5—5 of FIG. 3.
Figure 6:
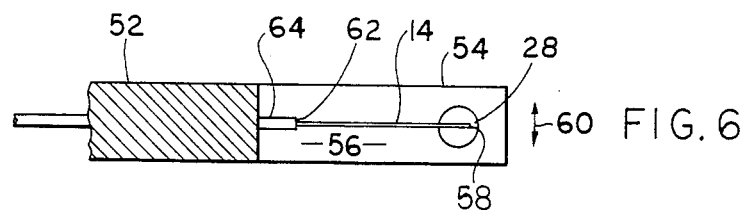
FIG. 6 is a horizontal sectional view taken along the line 6—6 of FIG. 3.
Figure 7:
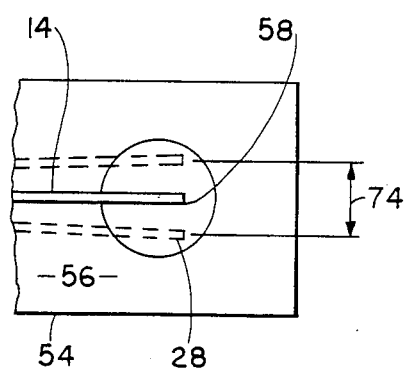
FIG. 7 is a further enlarged fragmentary view of the outer end of the structure of FIG. 6.
Figure 8:
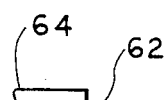
FIG. 8 is a further enlarged side elevational view of a field responsive element included within the structure of FIG. 3.
Figure 9:
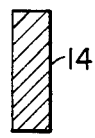
FIG. 9 is a greatly enlarged vertical sectional view taken along the line 9—9 of FIG. 8.

The element 14 is mounted for oscillation within a plane perpendicular to the light path and parallel to the wall portions 56, causing the outer end 58 to move in the direction designated 60 in FIGS. 4 and 6. This is accomplished by soldering or otherwise affixing one end of the element 14 to an outer end 62 of a conductive rod 64. The element 14 is thus cantilevered from the rod 64.

The probe head 52 is made of a high dielectric plastic or other suitable material, with the conductive rod 64 extending axially therethrough. The rod 64 is connected to a high voltage output line 66 of the power supply 18, for application of the necessary canceling voltage to the element 14.

The element 14 preferably comprises an elongated homogeneous structure of substantially rectangular or oblong cross-section. The greater lateral dimension of the element extends parallel to the light beam to constrain it to oscillation within a plane substantially perpendicular to the light beam. Because the element is much more flexible in the direction of its lesser cross-sectional dimension, it will oscillate almost exclusively in that direction.

In the preferred embodiment of the present invention, the element 14 comprises an elongated strip of spring steel of the type used to manufacture watch springs. The strip may be approximately 0.03 mm thick, 0.2 mm wide and 15.0 mm long. The conductive rod 64 is preferably made of iron or other suitable ferrous material to enable the steel element to be soldered thereto. The use of a conductive material for the element 14 is also advantageous in that the canceling voltage from the power supply 18 can be conducted to the tip 58 to precisely and repeatably cancel the electric field potential at that location. Alternatively, the element 14 could be made of a synthetic material, or even a human hair. However, in the case of a human hair the element would be more difficult to mount to the conductive rod 64 and would not be confined to oscillation within a predetermined plane.

The element 14 also need not be cantilevered from the probe 12. It will function in the intended manner as long as it is deflectable in response to an electric field to modulate the light beam between the waveguides 22 and 24. For example, a resilient element may be constructed to span a pair of mounting points (not shown), with maximum deflection occurring at the midpoint of the element. The light beam would then be directed at the midpoint for modulation.

In order to maximize the effect of an unbalanced field potential on the element 14, and thus maximize the modulation of the light beam by the element, the physical characteristics of the element 14 are chosen such that the applied field sets up a mechanical resonance therein. For a typical 60 hertz electric field the element 14 would be constructed to have a resonant oscillating frequency at 120 hertz Any unbalanced field potential would then apply a force which oscillates at the resonant frequency of the element, producing the maximum possible deflection of the element for a given potential. This increased deflection enhances the sensitivity of the apparatus 10. The altered traces of the scope 38 and the wave analyzer 40 are thus prominent for even small differences in potential, permitting an operator to determine precisely when the element stops oscillating.

Resonance of the element 14 can, of course, be achieved by constructing the element to have a set of physical parameters calculated to produce a desired resonant frequency. However, it is generally simpler to construct a probe in which the oscillating element is somewhat longer than that required for resonance and subsequently shorten the element in the presence of the field until maximum oscillation is obtained. The shortening of the element can be accomplished by repeatedly snipping small amounts of material from the free end thereof.

Referring now to FIG. 1, it can be seen that the power supply 18 comprises a phase shifter 68 and a variac 70 for altering the phase and amplitude of the voltage from the power supply 18. The output of the power supply can therefore be adjusted to precisely cancel the potential of the electric field at the location of the element 14.

The electric field about the sample 16 is generated by application of a preselected high voltage from a power supply 72. The sample 16 may comprise a bushing or other insulator element, as shown in FIG. 1, or a string of insulator elements connected in series. Such strings of insulator elements are commonly used in the suspension of high tension wires. Alternatively, the sample 16 may comprise virtually any circuit component about which it is desired to map an electric field. Due to its small size, the probe of the present invention is suitable for mapping the electric field within undercuts or other confined areas about insulator units, or inside housings of electrical equipment such as breakers and transformers.

In the method of the present invention, the waveform and frequency distribution of light from the source 30 are initially recorded from the scope 38 and the wave analyzer 40. The recorded information corresponds to the stationary mode of the element 14 and serves as a basis for comparison during a mapping operation. The probe 12 is then exposed to an electric field at a preselected location relative to a sample circuit element, causing the element 14 to oscillate at its resonant frequency. The element oscillates generally between the two broken line conditions of FIG. 7 to modulate the light beam and thereby alter the traces of the scope 38 and the wave analyzer 40. The magnitude 74 of oscillation at the tip 58 may be approximately 2 millimeters, corresponding to an overall angular deflection of the element of approximately 1 degree.

During the mapping method of the present invention, the probe 12 is preferably maintained in the orientation illustrated in FIG. 3. The element 14 then oscillates within a horizontal plane under the influence of the electric field.

With the element 14 at a preselected location within the field of the sample 16, the voltage output of the power supply 18 is varied in amplitude and phase until the scope 38 and the wave analyzer 40 again display traces corresponding to the element being stationary. The voltage applied to the element is then precisely equal and opposite to the potential of the electric field at that location, canceling the field potential and leaving the element stationary. Once this condition is obtained at a first known location, the probe 12 may be translated through the electric field to a plurality of other locations at which the element stops moving. Again, movement or lack of movement of the element is displayed by the traces of the scope 38 and the wave analyzer 40. Each location at which the element stops moving is recorded as one of the points 76 on a plot similar to that of FIG. 12, the points together defining one of the equipotential lines 78. After a first equipotential line has been fully plotted, the voltage is changed to balance the potential of the field at a location spaced from the first line. The method described above is then repeated to map another of the lines 78.

During operation of the apparatus 10, it is important to maintain the potential difference between the element 14 and the electric field as low as possible. To accomplish this, the potentials applied to the sample 16 and to the probe 12, respectively, can be incrementally increased in alternating fashion until the sample 16 reaches operating voltage. The potential applied to the probe will thus remain close to the potential of the electric field near the element 14, reducing the likelihood that the element 14 will generate a potentially damaging corona. If this method is not used, the element may burn up.

During a mapping operation, the potential of the element 14 relative to the field is further decreased by minimizing translational movement of the probe in a direction normal to the equipotential lines. The element is moved generally along a particular line to map out a plurality of equipotential points, rather than being repeatedly moved inwardly and outwardly relative to the field.

The apparatus 10 can be used to map AC electric fields of virtually any desired potential. While potentials between 5,000 and 10,000 volts are desirable in many circumstances, the apparatus 10 is also useful to map fields having overall potentials of one megavolt or more.

From the above, it can be seen that there has been provided an apparatus and method for simply and accurately mapping equipotential electric field lines about a wide variety of circuit components.

What is claimed is:

1. Apparatus for mapping an electric field, comprising:
   field responsive means;
   means for mounting the field responsive means for movement under the influence of an existing electric field;
   the mounting means comprising a movable probe element having a pair of opposed walls defining a slot, with the field responsive means mounted within the slot for mechanical oscillation in response to an electric field;
   means for passing a light beam between first and second spaced locations adjacent to the field response means, along a path that is interrupted by movement of the field responsive means;
   the light passing means comprising a first fiber optic waveguide terminating at the first location and a second fiber optic waveguide terminating at the second location, the first and second waveguides being mounted to the respective opposed side walls of the probe element in an essentially coaxial relationship and facing each other at the first and second locations for passage of light therebetween; and
   means for detecting modulation of the light beam by the field responsive means, the detecting means being associated with the waveguides and located remotely of the probe means to minimize disruption of the field.

2. The apparatus recited in claim 1 wherein the field responsive means has a resonant frequency of mechanical oscillation which is substantially twice the frequency of the AC electric field.

3. The apparatus recited in claim 1 which includes means for applying to the field responsive means a voltage essentially equal and opposite to the potential of the electric field at the location thereof.

4. The apparatus recited in claim 1 wherein the modulation detecting means comprises means for transforming the modulated light beam to an electrical signal.

5. The apparatus recited in claim 4 wherein the modulation detecting means further comprises means for detecting the waveform of the light beam after modulation by the field responsive means.

6. The apparatus recited in claim 4 wherein the modulation detecting means further comprises means for detecting the frequency distribution of the light beam after modulation by the field responsive means.

7. The apparatus recited in claim 1 wherein the mounting means is constructed and arranged to substantially limit movement of the field responsive means to oscillation within a plane perpendicular to the light beam.

8. The apparatus recited in claim 7 wherein the field responsive means is substantially rectangular in transverse cross-section.

9. The apparatus recited in claim 8 wherein the field responsive means is an elongated spring element.

10. A method of mapping an existing electric field, comprising:
    exposing a field responsive element to the electric field to produce mechanical oscillation of the element in response to the field;
    conducting a light beam to a first location along a first fiber optic waveguide, passing the beam from the first location to a second location along a path that is interrupted by movement of the element, and conducting the beam from the second location along a second fiber optic waveguide; and
    detecting modulation of the light beam by the element.

11. The method recited in claim 10 wherein a resonant condition is produced in the oscillating element by the electric field.

12. The method recited in claim 10 which includes the step of applying to the element a voltage which is essentially equal and opposite to the potential of the electric field at the location of the element, substantially nulling the electric potential at said location and causing the element to cease moving.

13. The method recited in claim 12 wherein after the electric potential is nulled at one location the element is translated through the electric field until the element ceases moving at a plurality of other locations, said locations defining an equipotential curve of the electric field.

14. The method cited in claim 12 wherein the step of detecting the modulation comprises transforming the modulated light beam to an electrical signal and analyzing the electrical signal to determine when the element ceases moving.

* * * * *